United States Patent [19]

Ida

[11] 4,291,276

[45] Sep. 22, 1981

[54] EQUALIZER AMPLIFIER

[75] Inventor: Masaru Ida, Hamamatsu, Japan

[73] Assignee: Nippon Gakki Seizo Kabushiki Kaisha, Hamamatsu, Japan

[21] Appl. No.: 91,484

[22] Filed: Nov. 5, 1979

[30] Foreign Application Priority Data

Nov. 16, 1978 [JP] Japan .................... 53-157836

[51] Int. Cl.³ .................................. H03F 1/34
[52] U.S. Cl. .................................... 330/85; 330/107; 330/109; 330/294; 330/304
[58] Field of Search ............... 330/85, 107, 109, 294, 330/304, 156

[56] References Cited

PUBLICATIONS

Kengla, C. T., Kise, T. L., *Active Low Pass Filter with Gain*, Aug. 1967, p. 344, IBM Technical Disclosure Bulletin, vol. 10, No. 3.

*Primary Examiner*—James B. Mullins
*Assistant Examiner*—Gene Wan
*Attorney, Agent, or Firm*—Frishauf, Holtz, Goodman and Woodward

[57] ABSTRACT

In an equalizer amplifier of RC attenuation type comprising an RC circuit having RIAA reproduction characteristics, the RC circuit is connected between an input of a first amplifier for amplifying an output signal of the RC circuit and an output of a second amplifier for amplifying an output signal of the first amplifier. One of the amplifiers is a noninverting amplifier, and the other is an inverting amplifier. So constituted, the equalizer amplifier increases apparently impedances of RC elements connected between the input of the first amplifier and the output of the second amplifier and permits the use of a capacitor of a smaller capacitance value which has good electrical characteristics.

8 Claims, 5 Drawing Figures

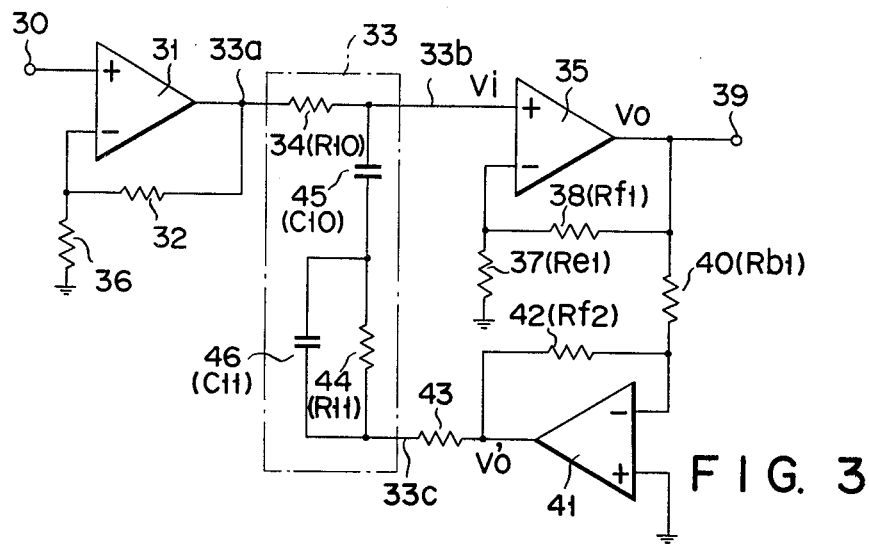
F I G. 3
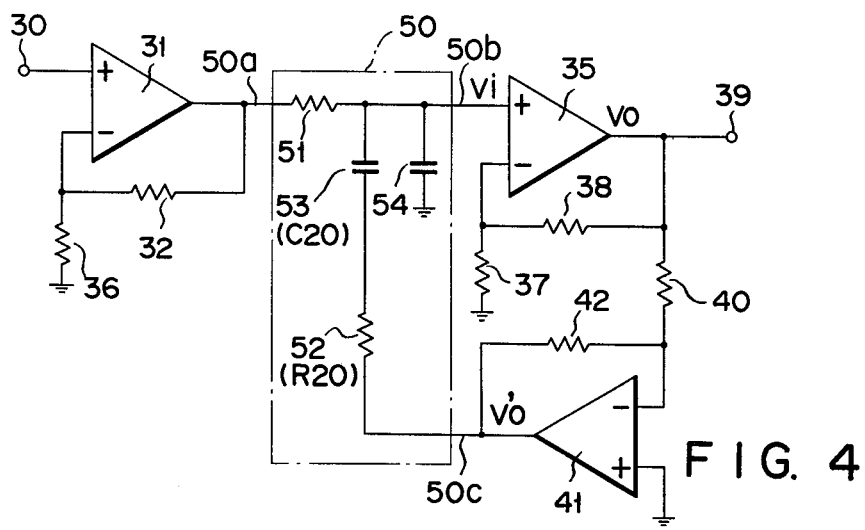
F I G. 4

EQUALIZER AMPLIFIER

BACKGROUND OF THE INVENTION

This invention relates to a frequency characteristic compensation circuit such as an equalizer amplifier which has an RC circuit network.

Equalizer amplifiers are classified generally into two types: RC (resistance-capacitance) attenuation type as shown in FIGS. 1A and 1B, and NFB (negative feedback) type as shown in FIG. 2.

In the known equalizer amplifier shown in FIG. 1A, an output signal of an amplifier 1 is applied to an RC circuit 2 having predetermined equalizer characteristics for amplitude correction. An output signal of the RC circuit is amplified by another amplifier 3 and led to an output terminal 4. Explanation will be made below of the case where the RC circuit 2 has known RIAA reproduction characteristics in which signal attenuation increases with increase in signal frequency. In this case, the RC circuit 2 is comprised of a resistor 5 of a resistance value R1 connected between the output of the amplifier 1 and the input of the amplifier 3, a capacitor 6 of a capacitance value C1 and a resistor 7 of a resistance value R2 connected in series between the input of the amplifier 3 and circuit ground, and a capacitor 8 of a capacitance value C2 connected in parallel with the resistor 7.

The RC circuit 2 has a transfer function G1 which is represented as follows:

$$G1 = \frac{s \cdot (C1 + C2) \cdot R2 + 1}{s^2 C1 \cdot C2 \cdot R1 \cdot R2 + s \cdot (C1 \cdot R1 + C2 \cdot R2 + C1 \cdot R2) + 1} \quad (1)$$

where $s = j\omega$. Transfer function Gr for the RIAA reproduction characteristics is expressed by the following formula:

$$Gr = \frac{(1 + s \cdot T2)}{(1 + s \cdot T1) \cdot (1 + s \cdot T3)} \quad (2)$$

where time constant $T1 = 3180$ μsec, $T2 = 318$ μsec, and $T3 = 75$ μsec.

As is evident from formulas (1) and (2), formula (1) can be rendered identical with formula (2) if R1, R2, C1 and C2 are properly selected.

In the known equalizer amplifier shown in FIG. 1B, and RC circuit 9 is comprised of a resistor 10 of a resistance value R3 connected between the output of amplifier 1 and the input of amplifier 3, a capacitor 11 of a capacitance value C3 and a resistor 12 of a resistance value R4 connected in series between the input of amplifier 3 and circuit ground, and a capacitor 13 of a capacitance value C4 connected in parallel with the capacitor 11 and the resistor 12. The RC circuit 9 has a transfer function G2 which is represented as follows:

$$G2 = \frac{s \cdot C3 \cdot R4 + 1}{s^2 \cdot C3 \cdot C4 \cdot R3 \cdot R4 + s \cdot (C3 \cdot R3 + C4 \cdot R4 + C3 \cdot R4) + 1} \quad (3)$$

Comparision of formula (3) with formula (2) shows that the RC circuit 9 illustrated in FIG. 1B can have the RIAA reproduction characteristics.

Both equalizer amplifiers mentioned above of RC attenuation type can provide accurate RIAA reproduction characteristics. But they are disadvantageous with respect to signal to noise (S/N) ratio and distortion characteristics. To improve the S/N ratio it is necessary that the output impedance of the RC circuit should be low since this impedance serves as an input resistance of the amplifier 3. To lower the output impedance of the RC circuit it is necessary to use capacitors of a large capacitance. From a viewpoint of electrical characteristics, however, a capacitor of a small capacitance is superior to a capacitor of a large capacitance.

In the equalizer amplifier of NFB type shown in FIG. 2, 2, an RC negative feedback circuit comprised of resistors 18 and 19 and capacitors 16 and 17 is connected between the input and output of an amplifier 15. With this circuit the feedback amount or factor increases with increase in the frequency of an input signal. As a result, the gain of amplifier 15 of FIG. 2 decreases with increasing frequency of the input signal. The equalizer amplifier has a transfer function G3 which is represented as follows:

$$G3 = \frac{R5 + R6}{Re} \cdot \frac{1 + s \cdot \frac{R5 \cdot R6}{R5 + R6} \cdot (C1 + C2)}{(1 + s \cdot C5 \cdot R5) \cdot (1 + s \cdot C6 \cdot R6)} + 1 \quad (4)$$

where, R5 and R6 denote the resistance values of the resistors 18 and 19, respectively, Re the resistance value of an input resistor 20 of the amplifiers 15, and C5 and C6 the capacitance values of the capacitors 16 and 17, respectively. Being of negative feedback type, the equalizer amplifier of FIG. 2 is advantageous over the equalizer amplifiers of FIGS. 1A and 1B with respect to S/N ratio and distortion characteristics. But it is relatively difficult for the equalizer amplifier of FIG. 2 to obtain accurate RIAA reproduction characteristics, as will be evident from formula (4).

SUMMARY OF THE INVENTION

An object of the invention is to provide an improved frequency characteristic compensation circuit such as an equalizer amplifier in which signal attenuation increases with increase in signal frequency, which increases apparently the capacitance value of a capacitor used and thus permits the use of a capacitor of a smaller capacitance value to obtain a desired frequency response.

According to the invention, an RC circuit with a frequency response to increase signal attenuation with increase in signal frequency is connected between an input of a first amplifier which amplifies an output signal of the RC circuit and an output of a second amplifier which amplifies an output signal of the first amplifier. One of the first and second amplifiers is a noninverting amplifier, and the other is an inverting amplifier. This arrangement apparently elevates the impedances of resistors and capacitors which are connected between the input of the first amplifier and the output of the second amplifier so that the same frequency characteristics as would be obtained if capacitors of a large capacitance were used may be obtained through the use of capacitors of a smaller capacitance.

BRIEF DESCRIPTION OF THE DRAWINGS

FIGS. 3 and 4 are circuit diagrams of equalizer amplifiers embodying the invention.

DESCRIPTION OF THE PREFERRED EMBODIMENTS

Figure 1A:
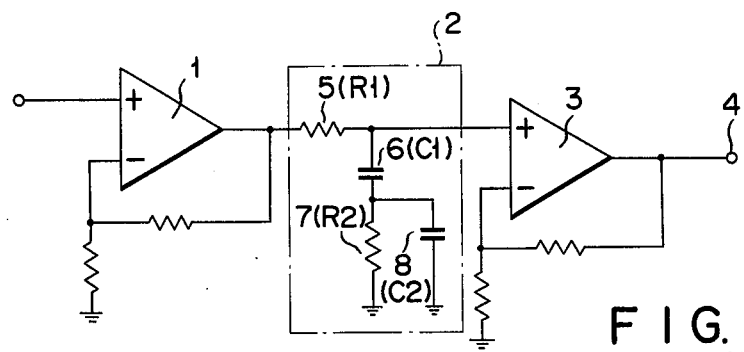
FIGS. 1A and 1B are circuit diagrams of known equalizer amplifiers of RC attenuation type.

In FIG. 3, an input signal is applied through an input terminal 30 to an noninverting input of an amplifier 31. The output of the amplifier 31 is coupled to an inverting input of the amplifier 31 by a feedback resistor 32. The inverting input of the amplifier 31 is connected to circuit ground via a resistor 36. The output of the amplifier 31 is connected also to a first terminal (input terminal) 33a of an RC circuit 33. A second terminal 33b (output terminal) of the RC circuit 33 is connected to a noninverting input of an amplifier 35. The output of the amplifier 35 is connected to an output terminal 39 and to an inverting input of the amplifier 35 by a feedback resistor 38. The inverting input of the amplifier 35 is connected to circuit ground via a resistor 37, and the output of the amplifier 35 is connected through a resistor 40 also to an inverting input of an amplifier 41. A noninverting input of the amplifier 41 is connected to circuit ground. The output of the amplifier 41 is connected to the inverting input of the amplifier 41 through a feedback resistor 42 and also to a third terminal 33c of the RC circuit 33 through a resistor 43.

The RC circuit 33 is identical in configuration with the RC circuit shown in FIG. 1A. That is, it is comprised of a resistor 34 connected between the first terminal 33a and the second terminal 33b, a resistor 44 and a capacitor 45 connected in series between the second terminal 33b and the third terminal 33c, and a capacitor 46 connected in parallel with the resistor 44.

According to the invention it is important that one of the amplifiers 35 and 41 functions as a noninverting amplifier and the other as an inverting amplifier. In the embodiment of FIG. 3 the amplifiers 35 and 41 are so connected as to function as a noninverting amplifier and an inverting amplifier, respectively. Instead, the amplifiers 35 and 41 may be so connected as to work as an inverting amplifier and a noninverting amplifier, respectively.

In operation of the equalizer amplifier of FIG. 3 an input signal applied to the input terminal 30 is amplified by the amplifier 31 and then attenuated by the RC circuit 33 according to the RIAA reproduction curve. The signal thus attenuated is amplified by the amplifier 35 and transmitted through the output terminal 39 to a succeeding circuit (not shown).

The output signal of the amplifier 41 which is 180° out of phase with the output signal of the amplifier 35 and the input signal of the amplifier 35, i.e. output signal of the RC circuit 33 appearing at the second terminal 33b is applied to the third terminal 33c of the RC circuit 33. This varies the apparent impedances of the elements 44, 45 and 46 which are connected between the second terminal 33b and third terminal 33c of the RC circuit 33. Let Vi and Vo' denote the input voltage of the amplifier 35 and the output voltage of the amplifier 41, respectively. Then, the apparent capacitance of the capacitor 45 becomes $Vi-Vo'/Vi$ times the actual capacitance C10 of the capacitor 45. Similarly, the apparent capacitance of the capacitor 46 becomes $Vi-Vo'/Vi$ times the actual capacitance C11 of the capacitor 46. Further, the apparent resistance of the resistor 44 becomes $Vi/Vi-Vo'$ times the actual resistance R11 of the resistor 44. Thus, to give the equalizer amplifier of FIG. 3 the same frequency characteristics as the equalizer amplifier of FIG. 1A, the actual capacitance C10 of the capacitor 45, the actual capacitance C11 of the capacitor 46 and the actual resistance R11 of the resistor 44 may be determined by the following equations:

$$R11 = R2 \times \frac{Vi - Vo'}{Vi} \quad (5)$$

$$C10 = C1 \times \frac{Vi}{Vi - Vo'} \quad (6)$$

$$C11 = C2 \times \frac{Vi}{Vi - Vo'} \quad (7)$$

Figure 2:
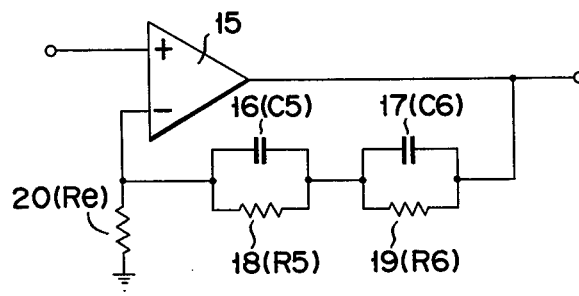
FIG. 2 is a circuit diagram of a known equalizer amplifier of NFB type.

The actual resistance R10 of the resistor 34 may be the same as R1 of the resistor 5 of FIG. 2.

The input voltage Vi and output voltage Vo of the noninverting amplifier 35 have the following relationship with the input voltage Vo and output voltage Vo' of the inverting amplifier 41.

$$Vo = \frac{Rf1 + Re1}{Re1} \times Vi \quad (8)$$

$$Vo' = -\frac{Rf2}{Rb1} \times Vo = -\frac{Rf2}{Rb1} \times \frac{Rf1 + Re1}{Re1} \times Vi \quad (9)$$

where Re1, Rf1, Rb1 and Rf2 denote the resistances of the resistors 37, 38, 40 and 42, respectively. Merely by selecting proper values for Re1, Rf1, Rb1 and Rf2, $Vi-Vo'$ can be made considerably larger than Vi. The capacitances C10 and C11 of the capacitors 45 and 46 can therefore be made much smaller than the capacitances C1 and C2 of the capacitors 6 and 8 of the equalizer amplifier shown in FIG. 1A in order to impart the same frequency characteristics to the equalizer amplifier shown in FIG. 3.

The equalizer amplifier of FIG. 3 is advantageous over the amplifier of FIG. 1A with respect to S/N ratio and distortion characteristics because the amplifier 41 provides a negative feedback. The resistor 43 is provided to prevent the gain of the amplifier 35 at a high frequency region from becoming zero.

Figure 1B:
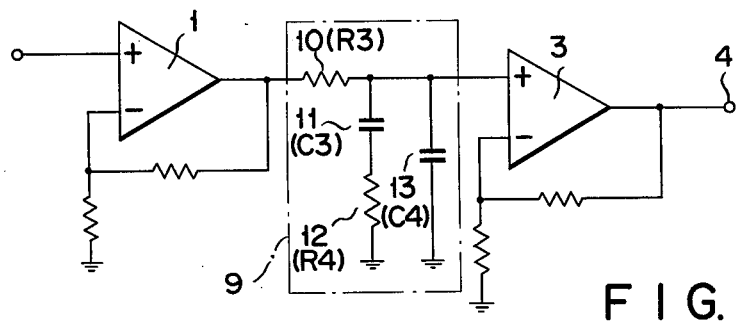

FIG. 4 shows another embodiment of the invention, which uses an RC circuit 50 of the same configuration as the RC circuit 9 of the amplifier shown in FIG. 1B. More specifically, the RC circuit 50 is comprised of a resistor 51 connected between a first terminal 50a and a second terminal 50b, a resistor 52 and a capacitor 53 connected in series between the second terminal 50b and a third terminal 50c, and a capacitor 54 connected between the second terminal 53b and circuit ground. The resistor 52 and the capacitor 53 may have a resistance R20 and a capacitance C20 which are represented as follows:

$$C20 = C3 \times \frac{Vi}{Vi - Vo'} \quad (10)$$

$$R20 = R4 \times \frac{Vi - Vo'}{Vi} \quad (11)$$

The resistor 51 and the capacitor 54 may have the same values as those of the resistor 10 and capacitor 13 shown in FIG. 1B.

The above-described embodiments of the invention are each an equalizer amplifier provided with an RC circuit which has the RIAA reproduction characteristics. Instead, the present invention may be applied to a lowpass filter provided with an RC circuit which is identical with the RC circuit 33 shown in FIG. 3 except in that it includes neither the resistor 44 nor the capacitor 46.

In the equalizer amplifiers of FIGS. 3 and 4, operational amplifiers are used as the amplifiers 31, 35 and 41. According to the invention, amplifiers of other types may be used.

What is claimed is:

1. An equalizer amplifier circuit comprising:
   an RC circuit having frequency characteristics substantially identical with the RIAA reproduction characteristics, said RC circuit including: a first terminal to receive an input signal; a second terminal to deliver an output signal; and a third terminal;
   a first amplifier having: an input coupled to said second terminal of said RC circuit; and an output; and
   a second amplifier having: an input coupled to said output of said first amplifier; and an output coupled to said third terminal of said RC circuit;
   one of said first and second amplifiers being a noninverting amplifier and the other of said first and second amplifiers being an inverting amplifier.

2. A circuit according to claim 1, wherein said first and second amplifiers are operational amplifiers.

3. A circuit according to claim 1 or 2, wherein said first amplifier is a noninverting amplifier, and said second amplifier is an inverting amplifier.

4. A circuit according to claim 1, further comprising a third amplifier having an output coupled to said first terminal of said RC circuit for applying said input signal to said first terminal of said RC circuit.

5. A circuit according to claim 1, wherein said RC circuit comprises:
   a first resistor connected between said first and second terminals;
   a first capacitor having two ends, one end being connected to said second terminal;
   a second resistor connected between said third terminal and the other end of said first capacitor; and
   a second capacitor connected in parallel with said second resistor.

6. A circuit according to claim 5, wherein said first amplifier is a noninverting operational amplifier; and said second amplifier is an inverting operational amplifier.

7. A circuit according to claim 1, wherein said RC circuit comprises:
   a first resistor connected between said first and second terminals;
   a first capacitor having two ends, one end being connected to said second terminal;
   a second resistor connected between said third terminal and the other end of said first capacitor; and
   a second capacitor connected between said second terminal and a given potential.

8. A circuit according to claim 7, wherein said first amplifier is a noninverting operational amplifier; and said second amplifier is an inverting operational amplifier.

* * * * *